(12) United States Patent
Huang et al.

(10) Patent No.: US 10,796,043 B1
(45) Date of Patent: Oct. 6, 2020

(54) NON-ADAPTIVE PATTERN REORDERING TO IMPROVE SCAN CHAIN DIAGNOSTIC RESOLUTION IN CIRCUIT DESIGN AND MANUFACTURE

(71) Applicant: Mentor Graphics Corporation, Wilsonville, OR (US)

(72) Inventors: Yu Huang, West Linn, OR (US); Jakub Janicki, Poznan (PL); Szczepan Urban, Gowarzewo (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/419,398

(22) Filed: May 22, 2019

(51) Int. Cl.
*G06F 30/30* (2020.01)
*G01R 31/3177* (2006.01)

(52) U.S. Cl.
CPC ......... *G06F 30/30* (2020.01); *G01R 31/3177* (2013.01)

(58) Field of Classification Search
USPC ....................................................... 716/111
See application file for complete search history.

(56) References Cited

U.S. PATENT DOCUMENTS 7,840,862 B2 * 11/2010 Huang ............... G01R 31/3177
714/726

OTHER PUBLICATIONS

Lin, Xijiang et al., "On Achieving Maximal Chain Diagnosis Resolution Through Test Pattern Selection", 2016 IEEE 25th Asian Test Symposium (ATS), Nov. 21-24, 2016, Hiroshima, Japan, 6 pages.
Huang, Yu et al., "Diagnosis with Limited Failure Information", 2006 IEEE International Test Conference, Oct. 22-27, 2006, Santa Clara, CA, 10 pages.
Huang, Yu et al., "Scan Chain Diagnosis by Adaptive Signal Profiling with Manufacturing ATPG Patterns", 2009 Asian Test Symposium, Nov. 23-26, 2009, Taichung, Taiwan, 6 pages.
Venkataraman, Srikanth et al., "Test Reordering for Improved Scan Chain Diagnosis using an Enhanced Defect Diagnosis Procedure", 2017 IEEE International Test Conference (ITC), Oct. 31-Nov. 2, 2017, Fort Worth, TX, 9 pages.
Wang, Hongfei et al., "Test-Data Volume Optimization for Diagnosis", Design Automation Conference 2012, Jun. 3-7, 2012, San Fransisco, CA, 7 pages.

* cited by examiner

Primary Examiner — Eric D Lee

(57) ABSTRACT

Systems and methods for re-ordering test patterns for circuit design or testing. A method includes receiving a set of scan chains and associated test patterns, and computing a penalty score for each test pattern in the set of test patterns. The method includes selecting a first pattern of the set of test patterns that has a lowest computed penalty score in the set of test patterns, and removing the first pattern from the set of test patterns and adding the first pattern to a set of ordered patterns. The method includes, for each remaining test pattern, computing an accumulated penalty score for each remaining pattern, selecting a next pattern of the set of test patterns that has a lowest accumulated penalty score in the set of test patterns, removing the next pattern from the set of test patterns, and adding the next pattern to the set of ordered patterns.

17 Claims, 6 Drawing Sheets

NON-ADAPTIVE PATTERN REORDERING TO IMPROVE SCAN CHAIN DIAGNOSTIC RESOLUTION IN CIRCUIT DESIGN AND MANUFACTURE

TECHNICAL FIELD

The disclosed technology is directed techniques for circuit design, testing, and manufacture.

BACKGROUND OF THE DISCLOSURE

Automatic Test Pattern Generation (ATPG) patterns that utilize scan chains to provide stimulus and capture responses from circuitry is a standard approach for manufacture testing to achieve test coverage in digital logic circuits. A "scan chain" technique is used in design for testing and makes testing easier by providing a simple way to set and observe every flip-flop in an integrated circuit (IC).

In a full scan design, automatic test pattern generation (ATPG) is particularly simple. No sequential pattern generation is required—combinatorial tests, which are much easier to generate, will suffice. In a chip that does not have a full scan design—i.e., the chip has sequential circuits, such as memory elements that are not part of the scan chain, sequential pattern generation is required. Test pattern generation for sequential circuits searches for a sequence of vectors to detect a particular fault through the space of all possible vector sequences.

Even a simple stuck-at fault requires a sequence of vectors for detection in a sequential circuit. Also, due to the presence of memory elements, the controllability and observability of the internal signals in a sequential circuit are in general much more difficult than those in a combinational logic circuit. These factors make the complexity of sequential ATPG much higher than that of combinational ATPG.

A significant weakness in scan-based diagnosis is the integrity of the scan chains. The amount of die area consumed by the scan flops, scan chain connections, and scan control circuitry can range from 15% to 30%. The number of die failing the scan chain integrity test will typically scale proportionally with the percentage of total circuitry involved with the scan chains. It has been reported that chain failures account for almost 50% of chip failures. In earlier stages of manufacturing, the percentage of scan chain failures could be more than 50%, and this number decreases with the yield becomes more mature.

Therefore, scan chain failure diagnosis is particularly important. Scan chain diagnosis can be utilized to quickly isolate the suspect defective scan cells and provide efficient guidance to Physical Failure Analysis (PFA) and yield enhancement. One major difference between volume production and failure analysis lab environments is the amount of failure information that can be logged with reasonable efforts. In a failure analysis lab, it is possible to collect many more failure cycles than in volume production environment. This can be done, for example, by iteratively applying the patterns and capturing a full buffer worth of failures from a sliding window. The resulting failure logs for different subset of patterns can be merged later for diagnosis. In the volume production environment, however, this method is not feasible because of the enormous time penalty incurred. Therefore, the total number of failing patterns/cycles that can be logged is restricted by the automated test equipment (ATE) fail buffer capacity and test time target. The limited number of failing patterns/cycles negatively impact the diagnostic resolution, especially for scan chain defect diagnosis in the volume production environment.

The amount of failure cycles required to properly diagnose chain failures is typically large. For each pattern (chain flush or scan pattern), a defect on a chain could easily cause about 50% of total flops on that chain to fail on ATE. As one example, in a design with embedded deterministic test (EDT) compression logic, if a faulty chain has 400 flops, a fail log of 5K cycles may only collect 5K/(400*50%)=25 failing patterns. Among these 25 failed patterns, there are a few chain patterns that only contribute to identifying the faulty chain and fault model. The diagnostic resolution therefore depends on the remaining ~20 scan patterns. However, the diagnosability (defined later) for different scan patterns varies significantly from pattern to pattern. Hence the diagnostic resolution is not guaranteed in current approaches. Improved systems are desirable.

SUMMARY OF THE DISCLOSURE

Automatic Test Equipment (ATEs) have fail buffer capacity limit, and the limited amount of collected failure data during testing has big negative impact on scan chain diagnostic resolutions. In the past, adaptive pattern reordering algorithms were proposed to improve the scan chain diagnostic resolutions. However in reality, either many ATEs do not support the proposed adaptive testing flows without additional test cost or the test engineers do not know how to program the ATEs to implement the proposed adaptive testing flows. Disclosed embodiments include a non-adaptive pattern reordering flow to improve the scan chain diagnostic resolution, which can be implemented in and improves current manufacture testing and volume diagnosis processes.

Various disclosed embodiments include systems and methods for re-ordering test patterns for circuit design or testing. A method includes receiving a set of scan chains and associated test patterns by a computer system. The method includes computing a penalty score for each test pattern in the set of test patterns. The method includes selecting a first pattern of the set of test patterns that has a lowest computed penalty score in the set of test patterns. The method includes removing the first pattern from the set of test patterns and adding the first pattern to a set of ordered patterns. The method includes computing an accumulated penalty score for each remaining pattern in the set of test patterns. The method includes selecting a next pattern of the set of test patterns that has a lowest accumulated penalty score in the set of test patterns. The method includes removing the next pattern from the set of test patterns and adding the next pattern to the set of ordered patterns. The method includes repeating steps for the accumulated penalty score until all test patterns have been removed from the set of test patterns and added to the set of ordered patterns.

Some embodiments further include storing the set of ordered patterns. In some embodiments, receiving the set of scan chains and associated test patterns includes performing an automated test pattern generation process. In some embodiments, the set of scan chains and associated test patterns are received from an automated test pattern generation process. In some embodiments, the penalty score for each pattern is a sum of squares of lengths of subchains of bits in the set of scan chains that do not include a sensitive bit corresponding to that pattern. In some embodiments, the accumulated penalty score for each remaining pattern is a sum of squares of lengths of subchain of bits in the set of scan chains that do not include a sensitive bit corresponding to that pattern or to any pattern in the set of ordered test patterns. Some embodiments further include performing an automated test engineering processes based on the ordered test patterns. Some embodiments further include modifying the set of ordered patterns according to one or more of test pattern compaction, design structure, compaction ratio, X-density in patterns, or advanced clocking schemes.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
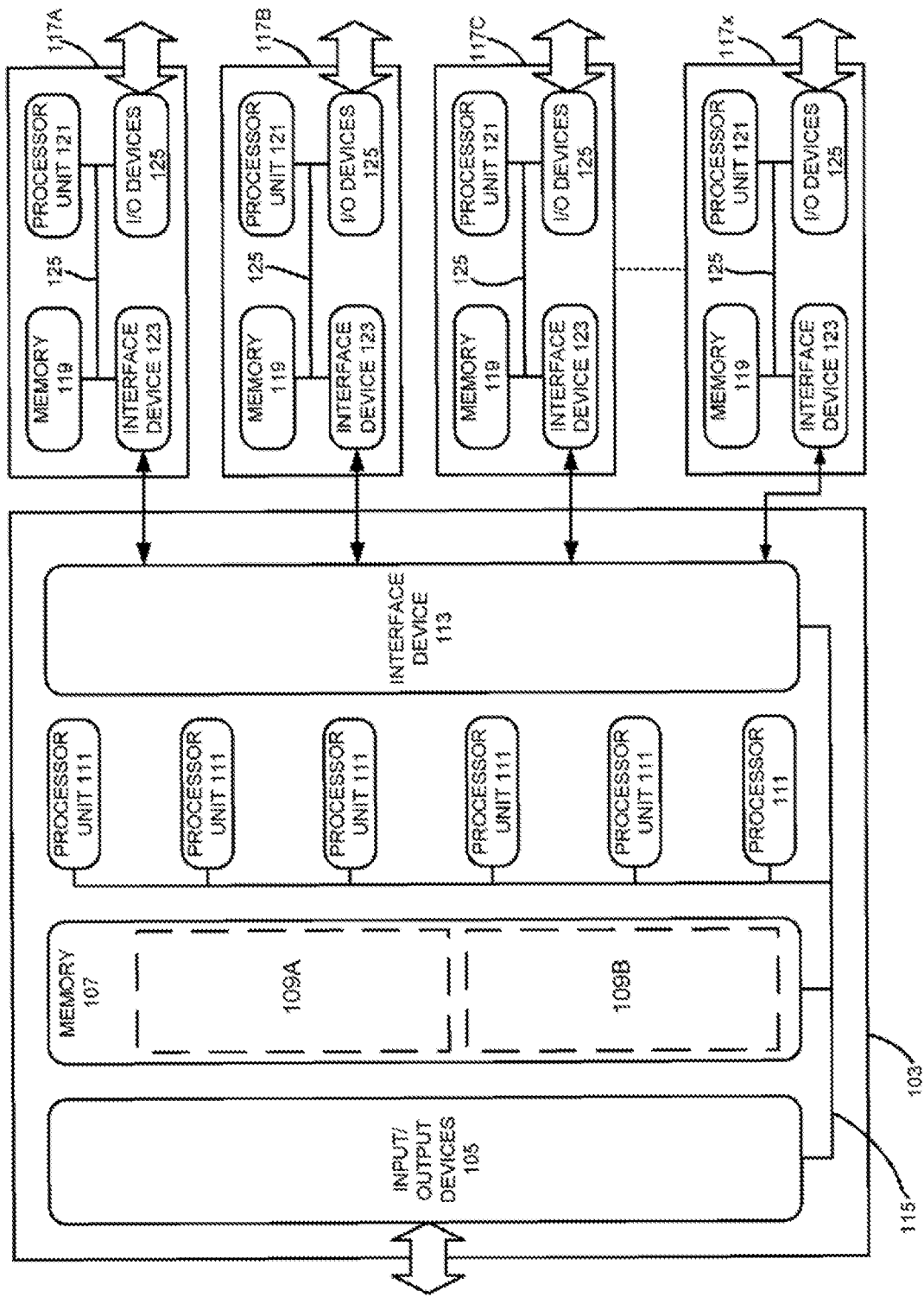
FIGS. 1 and 2 illustrate components of a computer system that may be used to implement various embodiments of the disclosed technology.

The Figures discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Scan chain reordering is the process of reconnecting the scan chains in a design to optimize for routing by reordering the scan connections to improve timing and congestion. Since logic synthesis arbitrarily connects the scan chain, it can be beneficial to perform scan reorder after placement so that the scan chain routing will be optimal.

One common feature shared by theoretical ATPG approaches is that they are all adaptive testing and diagnosis methods. Adaptive flow is useful in that it can identify the most useful patterns for diagnosing a particular faulty chain and a specific fault type. However, adaptive flow has significant limitations in actual implementations.

Adaptive test/diagnosis flows can be categorized based on when the decisions to make modifications and to which device(s) the modifications are applied. Two categories of adaptive testing flows are feed-forward and feedback. In a feed-forward approach, data collected from a previous test step stage is used to change how the same parts are tested at a future stage. By contrast, in a feed-back approach, data collected from a previous part(s) is used to modify the tests on different devices yet to be tested.

Prior theoretical adaptive pattern reordering methods are examples of feedback methods. To support adaptive test/diagnosis, these methods require that the ATE supports online analysis and dynamic decision making and that the test engineers know how to program ATEs adaptively. However, in most cases, semiconductor companies and test houses do not have one or both capabilities, and so these prior proposed adaptive flows have not been implemented.

Disclosed embodiments include non-adaptive flow techniques that can be easily incorporated to the current IC manufacturing industrial flow without incurring any adoption barriers, improving existing processes without the practical burdens of adaptive pattern reordering methods.

Illustrative Operating Environment

The execution of various processes described herein may be implemented using computer-executable software instructions executed by one or more programmable computing devices. Because these processes may be implemented using software instructions, the components and operation of a generic programmable computer system on which various embodiments of these processes may be employed will first be described. Further, because of the complexity of some electronic design and testing processes and the large size of many circuit designs, various electronic design and testing tools are configured to operate on a computing system capable of simultaneously running multiple processing threads. The components and operation of a computer system having a host or master computer and one or more remote or slave computers therefore will be described with reference to FIG. 1. This operating environment is only one example of a suitable operating environment, however, and is not intended to suggest any limitation as to the scope of use or functionality of any implementations of the invention.

In FIG. 1, the computer system 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other non-transitory storage medium that can be used to store desired information. As used herein, the term "non-transitory" refers to the ability to store information for subsequent retrieval at a desired time, as opposed to propagating electromagnetic signals.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire®. microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
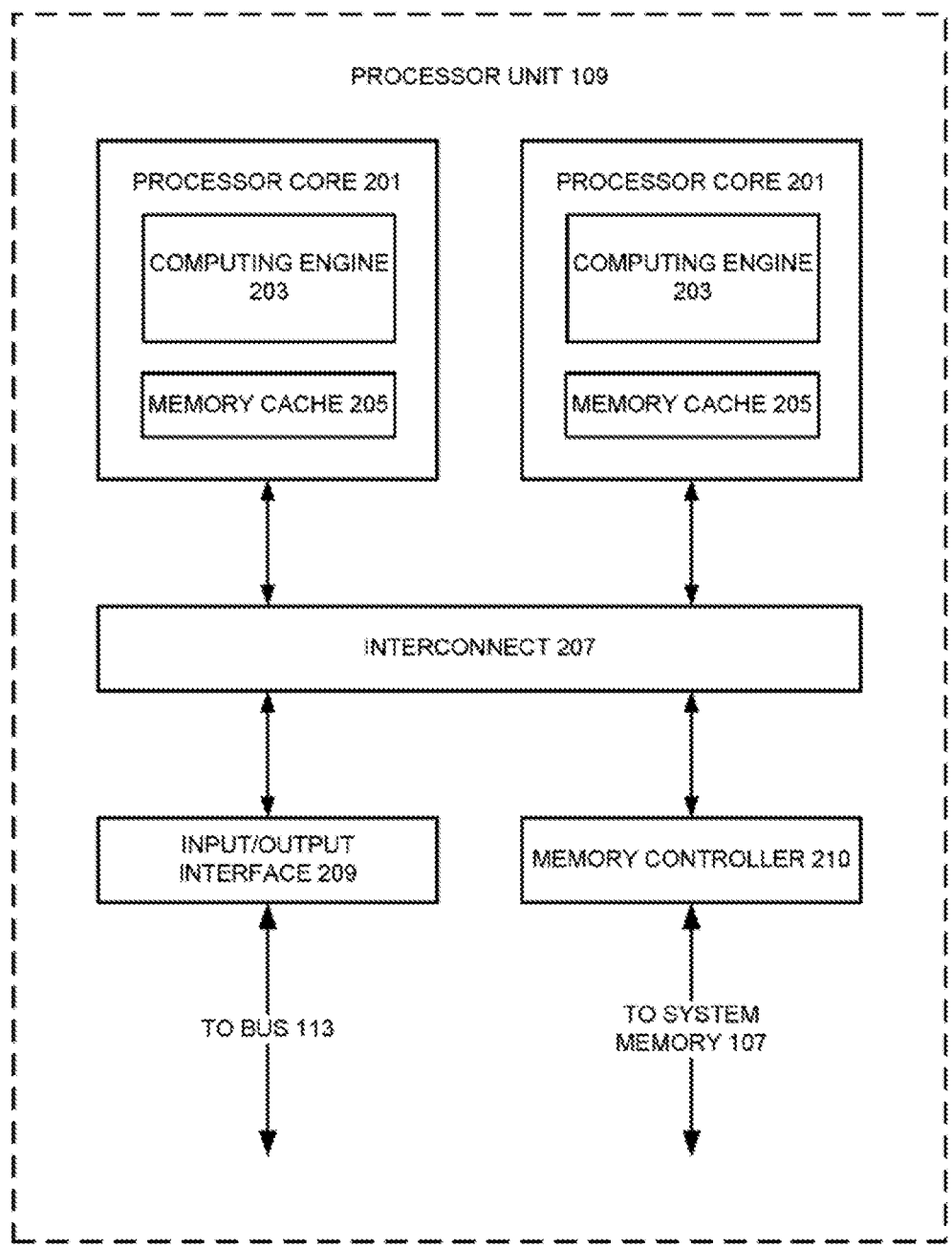

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, an alternate implementation of the computing system 101 may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 1157, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel®. Pentium®. or Xeon™ microprocessors, Advanced Micro Devices Athlon™ microprocessors or Motorola 68K/ Coldfire®. microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the technology may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the computer system 101, the master computer 103 may be connected to one or more external data storage devices. These external data storage devices may be implemented using any combination of non-transitory computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the computer system 101, one or more of the slave computers 117 may alternately or additions be connected to one or more external non-transitory data storage devices. Typically, these external non-transitory data storage devices will include data storage devices that also are connected to the master computer 103, but they also may be different from any data storage devices accessible by the master computer 103.

It also should be appreciated that the description of the computer system 101 illustrated in FIG. 1 and FIG. 2 is provided as an example only, and it not intended to suggest any limitation as to the scope of use or functionality of various embodiments of the invention.

Chain Diagnosability

To measure the chain diagnosability of a pattern, "sensitive bits" are used in the pattern shifting values. One diagnosis algorithm includes four primary steps, as described below.

Step 1: Use chain patterns to identify fault chain(s) and fault model of each faulty chain.

Step 2: For each scan pattern, X-mask all the sensitive bits in the loading values. The "sensitive bits" refers to the cell values that may be changed during scan chain shift operations under the current fault model identified in Step 1. For different fault models, the sensitive values are also different. For example, suppose a scan pattern has good machine loaded value 001110011010 on the faulty chain. If a stuck-at-1 fault is identified in step 1, all "0"s will become sensitive bit, and the loaded values will be modified as XX111XX11X1X, with "X" designating a bit that had been changed, as an x-masked sensitive bit.

Step 3: Simulate all X-masked scan patterns. For each cell i on the faulty chain, statistically count two numbers. (1) Sen(i) is the number of scan patterns that capture a sensitive bit on cell i on the faulty chain. For circuit with embedded compactors, Sen(i) is the number of scan patterns that capture a sensitive bit on cell i on the faulty chain and have a binary value at cycle i on the faulty channel after compaction. (2) Fail(i) is the number of times that Sen(i) failed on ATE. Next, for each cell, a failing probability $P_{fail}(i)$ is calculated as $P_{fail}(i)=Fail(i)/Sen(i)$, when Sen(i) is not 0. In case Sen(i) is 0, $P_{fail}(i)$ will be interpolated based on the value of $P_{fail}(i-1)$ and $P_{fail}(+1)$.

Step 4: Ranking. If a defect can be modeled with a permanent fault, and assume the defect is at the scan output of cell i on a chain with N scan cells, $P_{fail}(0)$, $P_{fail}(1)$, ... $P_{fail}(i-1)$ should be all 0, while $P_{fail}(i)$, $P_{fail}(i+1)$, ... $P_{fail}(N-1)$ should be all 100%. Hence, in this ideal case, the defect location is easily identified. However, for many chain fault diagnosis cases in practical applications, this is not the case. In this approach, the ranking is based on some heuristics to detect a jumping edge.

Based on the above process, the more captured sensitive bits a pattern has, the larger contribution it may have to the final diagnostic resolution. Given a set of N scan patterns, disclosed embodiments can identify a reordered pattern set such that it can achieve the highest possible diagnostic resolution on average, without knowing the faulty chain and fault type up front. Essentially this is a non-adaptive flow such that the reordered patterns can be applied to ATE just as regular manufacturing ATPG patterns, but it improves scan chain diagnosis in general. The diagnosability of a single fault type for a set of scan patterns is defined as:

$$\text{Scan Chain Diagnosability}(N) = \frac{\left(\sum_{n=1}^{N}\sum_{k=1}^{C}\text{Unique Captured Sensitive Bits}\right)}{S}$$

where N is the number of scan patterns, C is the total number of scan chains, S is the total number of scan cells. The above definition sums all unique captured sensitive bits from all scan patterns over all scan chains. Here, "unique" means it is only counted once even if multiple patterns have captured sensitive bits at the same scan cell. Its value is between 0% and 100%. When it reaches 100%, it means that using the current pattern set, the perfect diagnostic resolution can be achieved.

Pattern Reordering Flow

There are several factors that can cause problems in achieving high diagnosability for a given scan chain.

One impact factor is test pattern compaction. Disclosed processes improve diagnostic resolutions for designs with or without test response compaction. For designs with test compaction, it is assumed an XOR-tree-based compactor, such as an EDT, is used. With the presence of test compaction, it normally has two types of patterns: (A) masking patterns that mask all but one scan chain for each compactor output channel and (B) non-masking patterns that all scan chains are compacted through XOR trees. From the standpoint of chain diagnosis, masking patterns are generally worthless for the chains being masked but are very useful for the chains being observed uniquely at each compactor output channel. On the other hand, non-masking patterns may still provide some unique captured sensitive bits for some chains. When using an XOR based compactor, the factors that impact chain diagnosis include (A) the design structure, (B) the compaction ratio (the number of internal scan chains connected to single compactor output channel), and (C) the X-density in patterns. Disclosed embodiments can reorder patterns given these factors related to test pattern compaction.

Another impact factor is advanced clocking schemes. Modern designs normally have multiple clock domains. In such designs, a subset of patterns will only pulse a subset of clocks. This is especially impactful with hierarchical designs and test procedures consisting of multiple capture procedures. If a pattern does not pulse the clocks of any scan cells in a chain, this pattern does not have any contribution in diagnosing this chain. Such patterns are not considered as capture patterns for such chains during analysis. However, a pattern may be good to diagnose some chains but at the same time could be bad to diagnose some other chains. Disclosed embodiments can reorder such patterns to benefit diagnosing the majority chains.

Note also that asynchronous set/reset signals can be treated as special clocks. In the case of scan models including asynchronous set/reset signals, any manipulation of this signal may capture large number of sensitive bits even with a single pattern, independently of the loaded data. Such patterns provide valuable fault observation capability with the highest diagnosability.

Given many chain-diagnosis-impacting factors related to test pattern compaction and clocking schemes, disclosed embodiments can employ a unified pattern ranking system as described herein.

The disclosed sensitive bits analysis can include faulty chain observation. Disclosed processes can run pattern simulation based sensitive bit analysis for every scan chain with all its capture patterns as described above. To avoid rerunning the simulation for every possible fault type, the most conservative fault model (called "indeterminate fault") is assumed. In this approach, every scan cell on the scan chain being analyzed will be loaded with "X" for all its capture patterns, and any non-X unloaded value after capture on this chain is considered a sensitive bit. Pattern simulation is done for 64 patterns in parallel. Once simulation for a group of 64 patterns is completed, the number and distribution of sensitive bits is stored to be used in the final part of the reordering process.

The disclosed sensitive bits analysis can include speedup heuristics. Simulating for all scan chains with all the capture patterns for each chain is a computationally expensive process. Disclosed embodiments can distribute the workload to speed up the run time. Note that analysis for every scan chain is orthogonal to any other scan chains. Hence the system can use multiple independent parallel processes, with each process analyzing one chain. The final results can then be merged and processed at the end. Additionally, some heuristics as described herein can be introduced to constrain the number of necessary simulation runs, based on the results observed.

The disclosed sensitive bits analysis can include a threshold to limit the required patterns per chain to be simulated. A lower-bound limit can be introduced, that will work as a satisfaction threshold of diagnosability for a given pattern set. Once N patterns satisfying the threshold of diagnosability are found, analysis of further pattern groups can be forfeited. This approach can prove to be very beneficial from runtime stand-point, but need not be used in every case.

The disclosed sensitive bits analysis can include sampled representation of patterns from every capture procedure group. In some cases, no sensitive bits may be found for a full simulated pattern group. This may be because there are too many X values loaded on that chain and these Xs are captured back to the scan cells of that chain. Taking into account the random nature of these patterns, it is very unlikely to see any sensitive bits in future groups. Further simulation of patterns in the current capture procedure group can be forfeited.

Pattern Reordering

A pattern ordering in accordance with disclosed embodiments is described below. In practice, it is very difficult to achieve 100% diagnosability, and the average diagnosability is not a very useful metric. Instead, the sensitive bits distribution is a more effective measure, because it can indicate the average diagnostic resolution.

In principal, the disclosed process selects the minimal test patterns to minimize the average scan segment length without sensitive bits. This process uses a penalty score that can be used to formulate the whole problem as a minimal cover problem. A heuristic iterative greedy algorithm is deployed here to find the sequence of test patterns that in the best way improve the distribution of sensitive bits. Given a pattern i that is under analysis, the penalty score for this pattern is given by the sum of powers of scan segments lengths without any sensitive bits if this pattern is applied, which is determined by the following heuristic formula:

$$PENi = \sum_{n=1}^{N} \sum_{k=1}^{Kn} \Delta_{nk}^{C}$$

where N is the number of scan chains, Kn is the number of scan segments without sensitive bits in $n^{th}$ scan chain, $\Delta nk$ is the length of corresponding scan segment, and C is a user-defined constant that allows setting penalty for longer segments of scan cells not covered by any sensitive bits. For simplicity, in an exemplary implementation, the chosen value of C is equal to 2. In other words, the best candidate is a test pattern that features the subset of unique captured sensitive bits, which were not yet included by previously ordered patterns. Newly added sensitive bits contribute to decrease the overall average scan segment size without sensitive bits.

In a pattern reordering process as described herein, the computer system receives a set of test patterns. This can be accomplished by the computer system performing an ATPG process on a circuit design to generate the set of test patterns or by the computer system receiving or loading test patterns previously generated by an ATPG process.

The computer system iterates over all not-yet-reordered test patterns in the set of test patterns and expands the new test pattern sequence by adding one pattern with the lowest accumulated penalty score.

The computer system updates the accumulated penalty score for every remaining unsorted pattern will be updated.

The computer system repeats the process of reordering, above. The process of test pattern reordering terminates when either all test patterns are reordered or the remaining patterns do not add any new unique sensitive bits that can improve diagnostic resolution.

The computer system stores the final reordered test patterns. The final reordered test patterns determines the actual order according to which successive tests will be applied on ATE.

Figure 3:
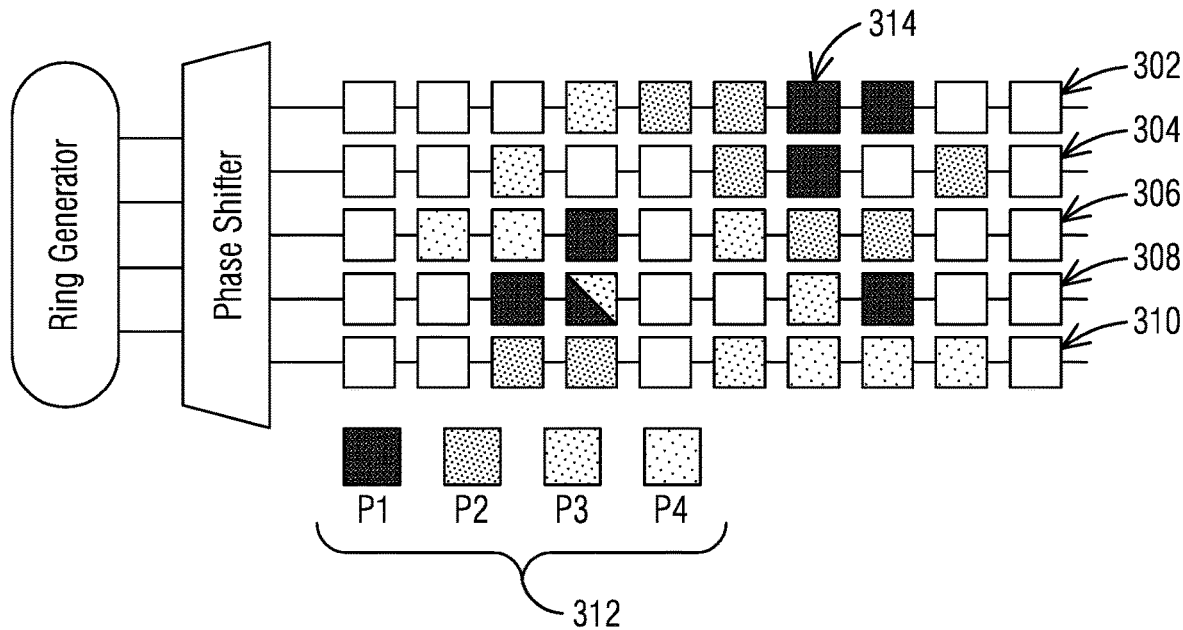
FIG. 3 illustrates an example of captured sensitive bits of patterns in accordance with disclosed embodiments.

FIG. 3 illustrates an example of captured sensitive bits of patterns P1-P4. This example shows four test patterns (P1-P4). Different colors or shading patters of scan cells correspond to sensitive bits originating from different test patterns.

To illustrate a process as disclosed herein, consider an example of reordering a simple set of four test patterns (P1-P4) as in FIG. 3. FIG. 3 illustrates a set of five scan chains 302, 304, 306, 308, 310 for use in this example. These scan chains can be fed to an EDT decompressor. Different colors or shading patterns of scan cells correspond to sensitive bits originating from different test patterns. For example, sensitive bit 314 corresponds to test pattern P1 of test patterns 312. It is assumed that these sensitive bits are computed for indeterminate fault model so they can be used to improve diagnosis resolution for any fault models. As shown in FIG. 3, the first scan chain 302 contains five sensitive bits including two bits from P1, two bits from P2 and one bit from P3.

Figure 4:
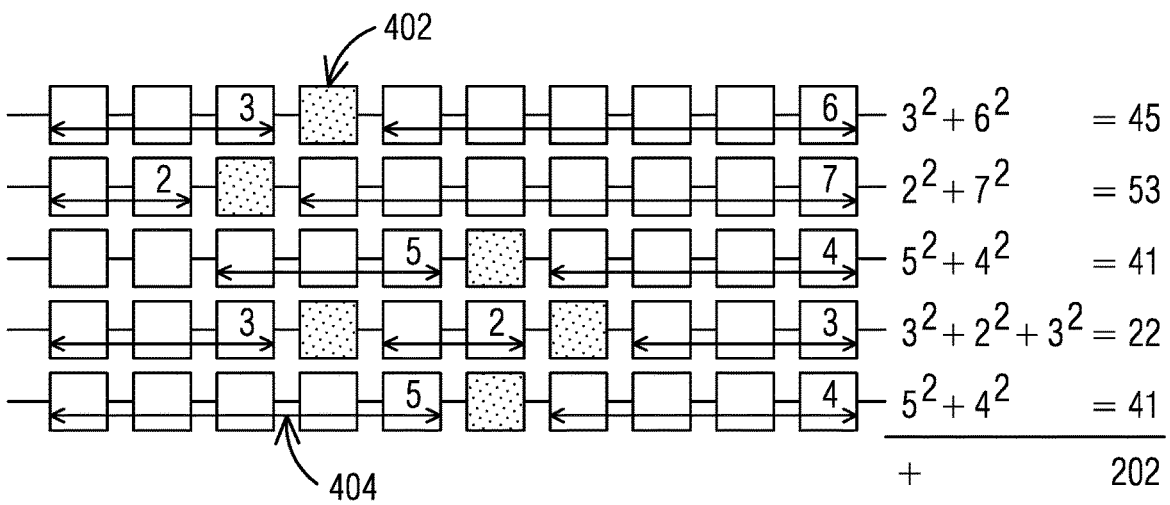
FIG. 4 illustrates sensitive bits distribution and the penalty score calculation for a pattern in accordance in accordance with disclosed embodiments.

FIG. 4 illustrates sensitive bits distribution and the penalty score calculation for pattern P3 in accordance with this example. The length of each scan segment without sensitive bits is highlighted using a solid bar as at subchain 404 (red color), with each sensitive bit shaded as at 402. Each subchain in a scan chain is the chain of contiguous bits that does not include a sensitive bit for a given pattern or patterns. Note that, in the example of FIG. 4, the subchains for pattern P3 include all bits except the sensitive bits identified by pattern P3, even if the subchains include sensitive bits identified by other patterns.

In this example, the penalty score calculated for P3 is PEN3=202, as the sum of the squares of the length of each non-sensitive-bit chain. A similar calculation can be performed for each of the other three patterns to get PEN1=247, PEN2=242, and PEN4=487. Note that the example of FIG. 4 only illustrates how to calculate PEN3 for pattern P3.

The computer system therefore selects pattern P3 as the first pattern because it has the lowest penalty score of the set.

The computer system next computes the accumulated penalty score of pattern P3 with each of the remaining patterns and selects the pattern leading to the lowest accumulated penalty score.

Figure 5A:
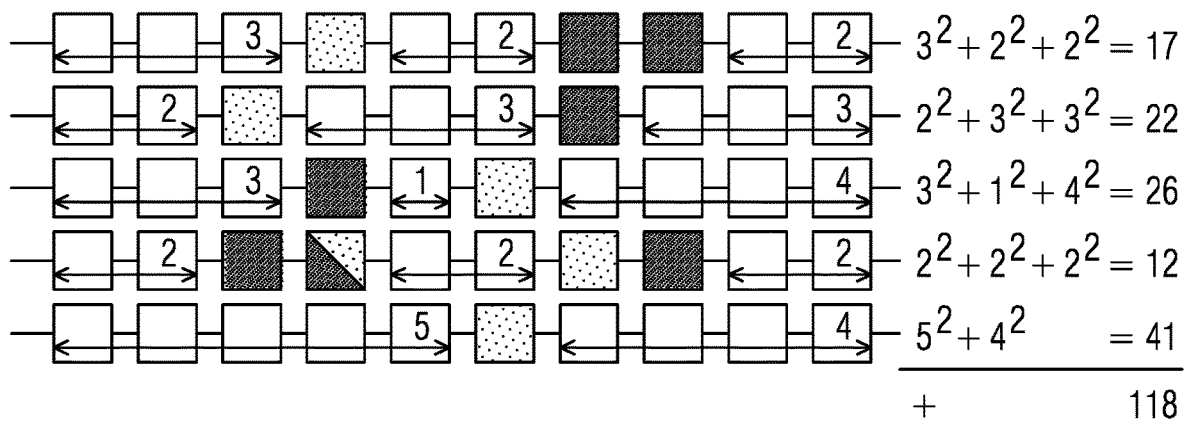
FIGS. 5A-5C illustrate accumulated penalty score calculations for pairs of patterns in accordance with disclosed embodiments.
Figure 5B:
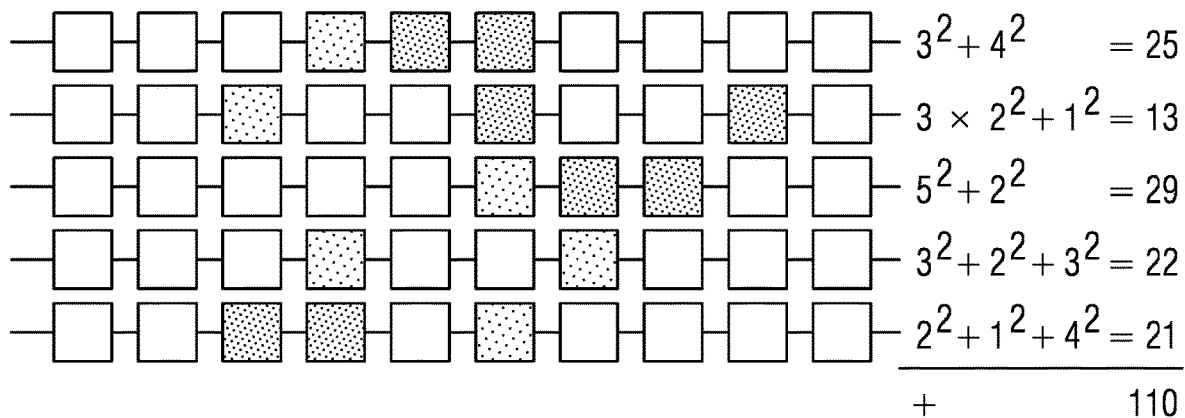
Figure 5C:
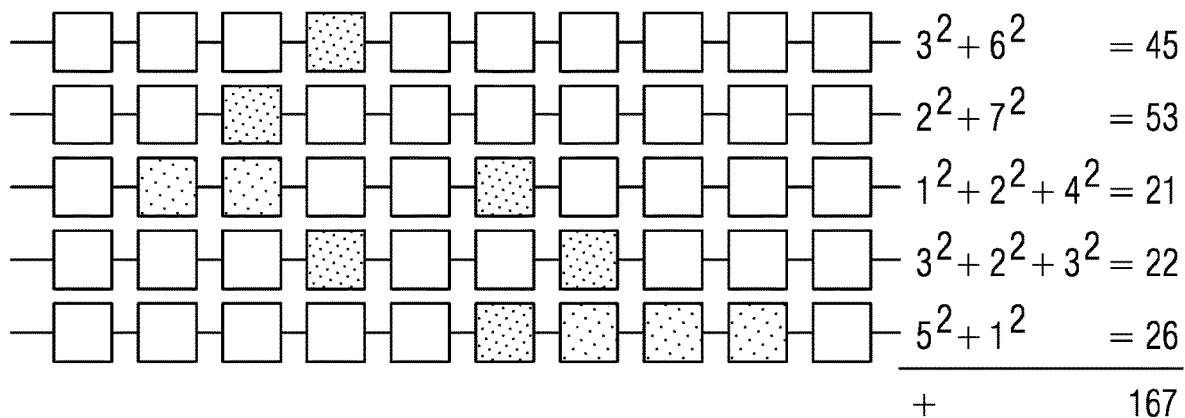

FIGS. 5A-5C illustrates the accumulated penalty score calculations for every pair of patterns of (P3, P1), (P3, P2) and (P3, P4) respectively.

FIG. 5A illustrates the accumulated penalty score calculations for pattern pair (P3, P1). In this example, the chains are identified by excluding both the sensitive bits of the previously-selected pattern P3 (and any other previously-selected pattern, in further iterations) and the current pattern P1, then the sum of the chain lengths is accumulated as above as $PEN_{3,1}=118$.

FIG. 5B illustrates the accumulated penalty score calculations for pattern pair (P3, P2). In this example, the chains are identified by excluding both the sensitive bits of the previously-selected pattern P3 and the current pattern P2, then the sum of the chain lengths is accumulated as above as $PEN_{3,2}=110$.

FIG. 5C illustrates the accumulated penalty score calculations for pattern pair (P3, P4). In this example, the chains are identified by excluding both the sensitive bits of the previously-selected pattern P3 and the current pattern P4, then the sum of the chain lengths is accumulated as above as $PEN_{3,4}=167$.

The lowest accumulated penalty score is $PEN_{3,2}=110$, when applying P3 followed by P2. In this example, pattern P2 is selected as the next pattern in the reordering since it has the lowest accumulated penalty score with respect to previously-selected patterns. Thus, the computer system selects pattern P2 as the second pattern in the reorder list.

At this point, the reordered patterns are P3, P2 (in that order), and the process can then compute the accumulated penalty scores with respect to each pair of those combined patterns and the remaining patterns. In this example, the computer system would compute the accumulated penalty scores of (P3P2, P1) and (P3P2, P4). The lowest accumulated penalty score of those pairs identifies the next (third) pattern on the reordered list (P4 in this example), and then the remaining pattern (P1) would be last on the list.

The computer system continues the process until all available patterns have been examined or it is not possible to minimize the accumulated penalty score. In this example, the final pattern ordering is P3, P2, P4, and P1. A similar process can be performed for any number of patterns.

Figure 6:
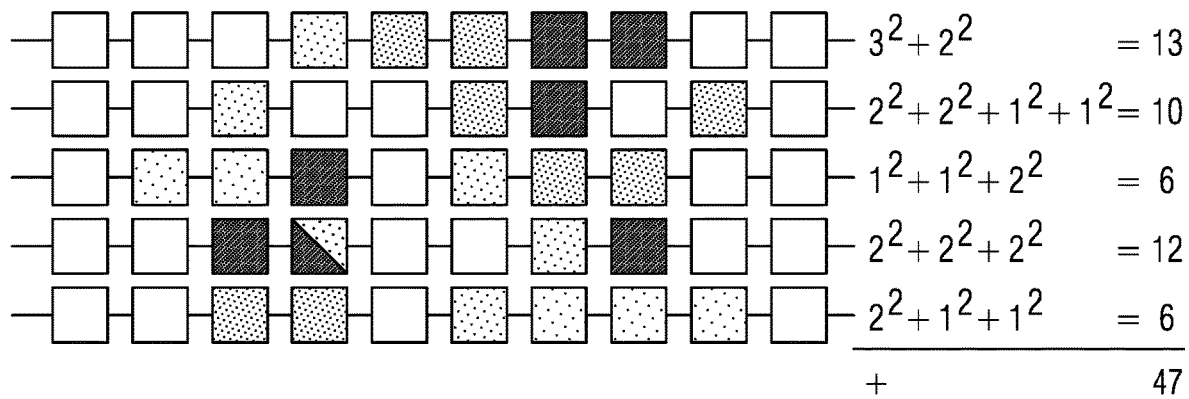
FIG. 6 illustrates a final accumulated penalty score calculation in accordance with disclosed embodiments.

FIG. 6 illustrates the final accumulated penalty score calculation for patterns (P3, P2, P4, P1) as $PEN_{3,2,4,1}=47$.

A process as disclosed herein improves sensitive bits distribution. The sensitive bit fill rate (with SBXX indicates the sensitive bit fill rate reached XX %,) as defined herein is a ratio of unique sensitive bits in a given test pattern subset (from Pattern P1 to Pk) to the total number of unique sensitive bits in all test patterns.

Figure 7:
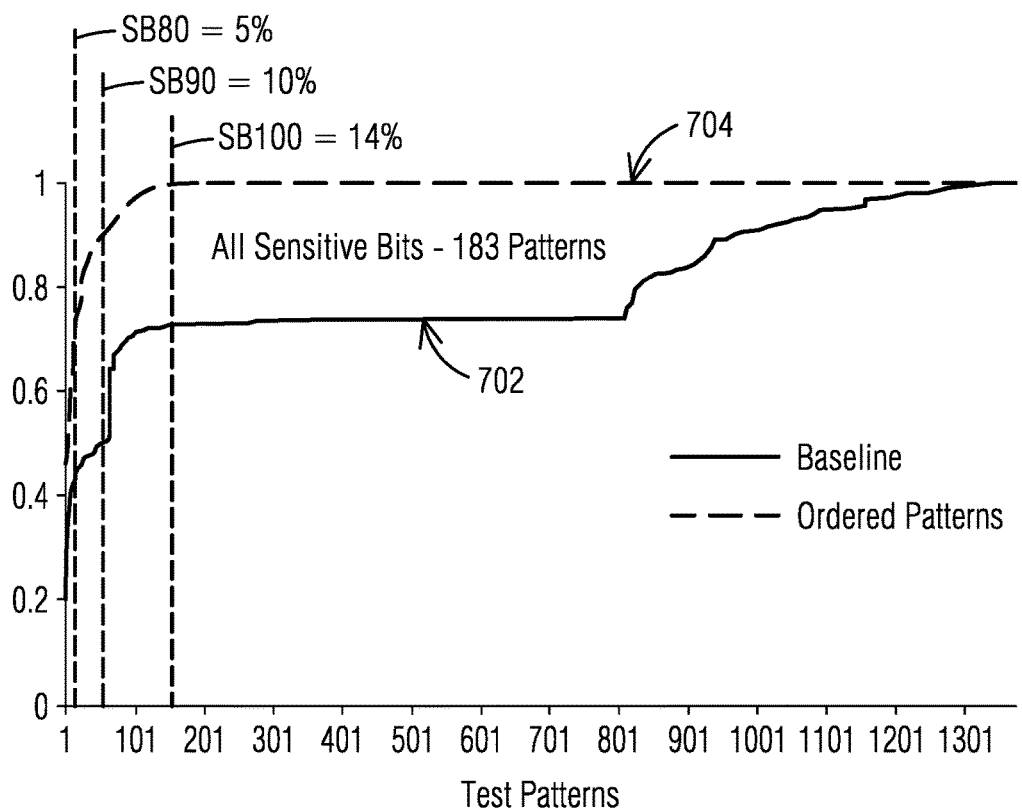
FIG. 7 illustrates a profiling analysis using disclosed techniques for sample sensitive bit distributions.

FIG. 7 illustrates a profiling analysis using disclosed techniques for example sensitive bit distributions. The baseline 702 is for regular ATPG pattern ordering and the optimized result 704 is based on the test patterns reordered by the disclosed process. It clearly indicates that the reordered patterns can achieve much higher sensitive bit fill rate than for the baseline patterns at the same pattern count. With only 5%, 10% and 14% of the total patterns, it can achieve 80%, 90% and 100% of all unique sensitive bits respectively. As another comparison, the baseline test pattern set can achieve SB100 with 1301 patterns, whereas the reordered patterns can achieve SB100 with only 183 patterns, which is more than 7× pattern reduction.

Figure 8:
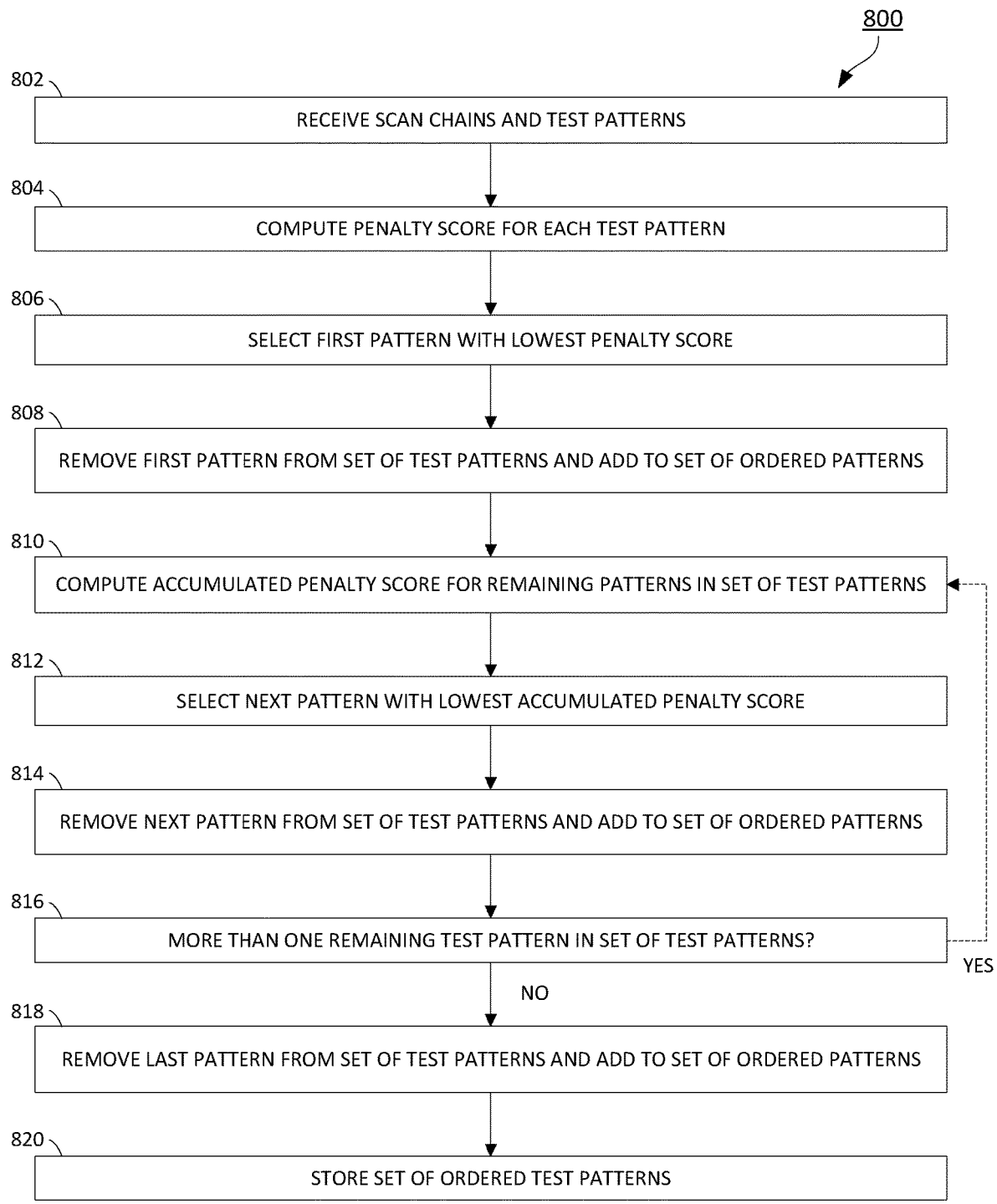
FIG. 8 illustrates a flowchart of a process in accordance with disclosed embodiments.

FIG. 8 illustrates a flowchart of a process 800 as disclosed herein that can be performed by one or more computer systems. The process of FIG. 8 can be considered in the context of the examples of FIGS. 3-7.

The computer system receives a set of scan chains and associated test patterns (802). The set of scan chains can be received in or as part of a design netlist, together with associated test patterns. This can be accomplished by the computer system performing an ATPG process on a circuit design to generate the set of scan chains and test patterns or by the computer system receiving or loading scan chains and test patterns previously generated by an ATPG process. The test patterns comprise one or more sensitive bits within the scan chains. The received set of test patterns can be an unordered set of test patterns.

The computer system computes a penalty score for each test pattern in the set of test patterns (804). The penalty score for each pattern can be the sum of the squares or to any selected power of the lengths of each subchain of bits in the set of scan chains that do not include a sensitive bit corresponding to that pattern.

The computer system selects a first pattern of the set of test patterns with the lowest penalty score in the set of test patterns (806).

The computer system removes the first pattern from the set of test patterns and adds the first pattern to a set of ordered patterns (808).

The computer system computes an accumulated penalty score for each remaining pattern in the set of test patterns (810). The accumulated penalty score for each remaining pattern can be the sum of the squares of the lengths of each subchain of bits in the set of scan chains that do not include a sensitive bit corresponding to that pattern or any pattern in the set of ordered test patterns. This can be performed as part as an iterative loop as long as there are remaining test patterns in the set of test patterns.

The computer system selects a next pattern of the set of test patterns with the lowest accumulated penalty score in the set of test patterns (812).

The computer system removes the next pattern from the set of test patterns and adds the next pattern to the set of ordered test patterns (814).

While there is more than one test pattern remaining in the set of test patterns (816), the system repeats to 810.

When there is only one test pattern remaining in the set of test patterns, the computer system removes the last pattern from the set of test patterns and adds the last pattern to the set of ordered test patterns (818).

The computer system stores the set of ordered test patterns (820). The system can thereafter perform automated test engineering processes based on the ordered test patterns, can modify a circuit design based on the ordered test patterns, can control the manufacture of a circuit based on the ordered test patterns, can transmit the ordered test patterns to another device or process, can display the ordered test patterns to a user, or perform other functions using the set of ordered test patterns.

A process as disclosed herein performs non-adaptive pattern reordering by analyzing the sensitive bit distribution and minimizing the average scan segment length without sensitive bits. A penalty score is defined to measure the overall scan segment lengths without sensitive bits. Disclosed embodiments include a heuristic iterative algorithm to achieve the highest diagnosability possible. The process can minimize the accumulated penalty score by selecting one best pattern at a time. Experimental testing has proved that the disclosed pattern reordering algorithm improves chain diagnostic resolutions. In some embodiments, the reordering process can also consider factors including one or more of test pattern compaction, design structure, compaction ratio, X-density in patterns, and advanced clocking schemes.

The following documents discuss aspects of scan chain diagnoses and related concepts, and are each hereby incorporated by reference:

1. Y. Huang, et al., "Diagnosis with Limited Failure Information," Proc. Int'l Test Conf., 2006, paper 22.2.
2. H. Wang et al., "Test-data volume optimization for diagnosis," in DAC, 2012, pp. 567-572.
3. X. Lin, S. M. Reddy and W.-T. Cheng "On Achieving Maximal Chain Diagnosis Resolution through Test Pattern Selection," Proc. Asian Test Conf., 2016, pp. 132-137.
4. S. Venkataraman et al., "Test Reordering for Improved Scan Chain Diagnosis using an Enhanced Defect Diagnosis Procedure," Proc. Int'l Test Conf., 2017, Paper 2.2.
5. Y. Huang et al., "Scan Chain Diagnosis by Adaptive Signal Profiling with Manufacturing ATPG Patterns," Proc. Asian Test Conf., 2009, pp. 35-40.
6. U.S. Pat. No. 7,840,862 entitled "Enhanced Diagnosis with Limited Failure Cycles."

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of the computer systems described herein may conform to any of the various current implementations and practices known in the art. Note in particular that data 109B of FIG. 1 may include any data used or described herein, including the set of scan changes, the associated test patterns, the penalty scores, the accumulated penalty scores, the set of ordered patterns, or other data.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor,"

or "controller," within a claim is understood and intended to refer to structures known to those skilled in the relevant art, as further modified or enhanced by the features of the claims themselves, and is not intended to invoke 35 U. S. C. § 112(f).

What is claimed is:

1. A method, comprising:
   (a) receiving a set of scan chains and associated test patterns by a computer system;
   (b) computing a penalty score for each test pattern in the set of test patterns;
   (c) selecting a first pattern of the set of test patterns that has a lowest computed penalty score in the set of test patterns;
   (d) removing the first pattern from the set of test patterns and adding the first pattern to a set of ordered patterns;
   (e) computing an accumulated penalty score for each remaining pattern in the set of test patterns;
   (f) selecting a next pattern of the set of test patterns that has a lowest accumulated penalty score in the set of test patterns;
   (g) removing the next pattern from the set of test patterns and adding the next pattern to the set of ordered patterns; and
   (h) repeating (e)-(g) until all test patterns have been removed from the set of test patterns and added to the set of ordered patterns,
   wherein the penalty score for each test pattern is a sum of squares of lengths of subchains of bits in the set of scan chains that do not include a sensitive bit corresponding to that pattern.

2. The method of claim 1, further comprising storing the set of ordered patterns.

3. The method of claim 1, wherein receiving the set of scan chains and associated test patterns includes performing an automated test pattern generation process.

4. The method of claim 1, wherein the set of scan chains and associated test patterns are received from an automated test pattern generation process.

5. The method of claim 1, wherein the accumulated penalty score for each remaining pattern is a sum of squares of lengths of subchains of bits in the set of scan chains that do not include a sensitive bit corresponding to that pattern or to any pattern in the set of ordered test patterns.

6. The method of claim 1, further comprising performing an automated test engineering processes based on the ordered test patterns.

7. The method of claim 1, further comprising modifying the set of ordered patterns according to one or more of test pattern compaction, design structure, compaction ratio, X-density in patterns, or advanced clocking schemes.

8. A computer system comprising:
   a processor; and
   an accessible memory, the computer system configured to:
   (a) receive a set of scan chains and associated test patterns by the computer system;
   (b) compute a penalty score for each test pattern in the set of test patterns;
   (c) select a first pattern of the set of test patterns that has a lowest computed penalty score in the set of test patterns;
   (d) remove the first pattern from the set of test patterns and adding the first pattern to a set of ordered patterns;
   (e) compute an accumulated penalty score for each remaining pattern in the set of test patterns;
   (f) select a next pattern of the set of test patterns that has a lowest accumulated penalty score in the set of test patterns;
   (g) remove the next pattern from the set of test patterns and adding the next pattern to the set of ordered patterns; and
   (h) repeat (e)-(g) until all test patterns have been removed from the set of test patterns and added to the set of ordered patterns,
   wherein the penalty score for each test pattern is a sum of squares of lengths of subchains of bits in the set of scan chains that do not include a sensitive bit corresponding to that pattern.

9. The computer system of claim 8, wherein the computer system is further configured to store the set of ordered patterns.

10. The computer system of claim 8, wherein receiving the set of scan chains and associated test patterns includes performing an automated test pattern generation process.

11. The computer system of claim 8, wherein the set of scan chains and associated test patterns are received from an automated test pattern generation process.

12. The computer system of claim 8, wherein the accumulated penalty score for each remaining pattern is a sum of squares of lengths of subchains of bits in the set of scan chains that do not include a sensitive bit corresponding to that pattern or to any pattern in the set of ordered test patterns.

13. The computer system of claim 8, wherein the computer system is further configured to perform an automated test engineering processes based on the ordered test patterns.

14. The computer system of claim 8, wherein the computer system is further configured to modify the set of ordered patterns according to one or more of one or more of test pattern compaction, design structure, compaction ratio, X-density in patterns, or advanced clocking schemes.

15. A non-transitory computer-readable medium storing executable instructions that, when executed, cause one or more computer systems to:
   (a) receive a set of scan chains and associated test patterns by a computer system;
   (b) compute a penalty score for each test pattern in the set of test patterns;
   (c) select a first pattern of the set of test patterns that has a lowest computed penalty score in the set of test patterns;
   (d) remove the first pattern from the set of test patterns and adding the first pattern to a set of ordered patterns;
   (e) compute an accumulated penalty score for each remaining pattern in the set of test patterns;
   (f) select a next pattern of the set of test patterns that has a lowest accumulated penalty score in the set of test patterns;
   (g) remove the next pattern from the set of test patterns and adding the next pattern to the set of ordered patterns; and
   (h) repeat (e)-(g) until all test patterns have been removed from the set of test patterns and added to the set of ordered patterns,
   wherein the accumulated penalty score for each remaining pattern is a sum of squares of lengths of subchains of bits in the set of scan chains that do not include a sensitive bit corresponding to that pattern or to any pattern in the set of ordered test patterns.

16. The non-transitory computer-readable medium of claim 15, wherein receiving the set of scan chains and associated test patterns includes performing an automated test pattern generation process.

17. The non-transitory computer-readable medium of claim 15, wherein the penalty score for each test pattern is a sum of squares of lengths of subchains of bits in the set of scan chains that do not include a sensitive bit corresponding to that pattern.

* * * * *